US008969911B2

(12) United States Patent
Wang et al.

(10) Patent No.: US 8,969,911 B2
(45) Date of Patent: Mar. 3, 2015

(54) PHOTO DETECTOR CONSISTING OF TUNNELING FIELD-EFFECT TRANSISTORS AND THE MANUFACTURING METHOD THEREOF (75) Inventors: Pengfei Wang, Shanghai (CN); Xi Lin, Shanghai (CN); Wei Wang, Shanghai (CN); Xiaoyong Liu, Shanghai (CN); Wei Zhang, Shanghai (CN)

(73) Assignee: Fudan Univeristy, Shanghai (CN)

( * ) Notice: Subject to any disclaimer, the term of this patent is extended or adjusted under 35 U.S.C. 154(b) by 302 days.

(21) Appl. No.: 13/446,834

(22) Filed: Apr. 13, 2012

(65) Prior Publication Data
US 2012/0261669 A1    Oct. 18, 2012

(51) Int. Cl.
*H01L 33/00* (2010.01)
*H01L 31/111* (2006.01)
*H01L 31/113* (2006.01)
*G02B 6/42* (2006.01)
*H01L 31/0232* (2014.01)
*H01L 31/18* (2006.01)

(52) U.S. Cl.
CPC .............. *H01L 31/1136* (2013.01); *G02B 6/42* (2013.01); *H01L 31/02327* (2013.01); *H01L 31/1804* (2013.01); *G02B 6/4214* (2013.01); *Y02E 10/547* (2013.01)
USPC ........................................... 257/116; 257/98

(58) Field of Classification Search
CPC ....................................................... H01L 27/304
USPC ........................................... 257/116; 438/72
See application file for complete search history.

(56) References Cited

U.S. PATENT DOCUMENTS

| 4,808,815 A * | 2/1989 | Langley .................. 250/227.28 |
| 7,354,780 B2 * | 4/2008 | Feng et al. ...................... 438/20 |
| 7,728,399 B2 * | 6/2010 | Walberg et al. ............... 257/434 |

* cited by examiner

*Primary Examiner* — Kevin Parendo
(74) *Attorney, Agent, or Firm* — Niro, Haller & Niro (57) ABSTRACT

The present invention belongs to the technical field of optical interconnection and relates to a photo detector, in particular to a photo detector consisting of tunneling field-effect transistors.

8 Claims, 7 Drawing Sheets

Figure 15

PHOTO DETECTOR CONSISTING OF TUNNELING FIELD-EFFECT TRANSISTORS AND THE MANUFACTURING METHOD THEREOF

BACKGROUND OF THE INVENTION

1. Technical Field

The present invention belongs to the technical field of optical interconnection and relates to a photo detector, in particular to a photo detector consisting of tunneling field-effect transistors.

2. Description of Related Art

Compared with the traditional aluminum, copper has the following advantages: 1, the resistivity of copper is smaller (Cu: 1.7 μΩ/cm, Al: 3 μΩ/cm; 2, the parasitic capacitance of the copper interconnection is smaller than that of the aluminum interconnection; 3, due to low resistance, the power consumption of the copper interconnection is smaller than that of the aluminum interconnection; 4, the electro-migration resistance of copper is better than that of aluminum (Cu<$10^7$ A/cm$^2$, Al<$10^6$ A/cm$^2$), connection cavities generated by electro-migration are avoided, so that the reliability of the device is improved. Therefore, devices adopting copper interconnections are able to meet the requirements of high frequency, high integration, large power, large capacitance and long service life; and the traditional aluminum interconnection process is gradually replaced by the copper interconnection process.

With the further development of integrated electronic device technology, the power consumption and delay of copper interconnections also has gradually failed to meet demands, so the pursuit of technology with lower power consumption and faster interconnection is the future development trend. Compared with copper interconnections, optical interconnections have the advantages of high bandwidth and low loss, and have no problems in crosstalk, matching, and electromagnetic compatibility. The single-chip optical interconnection has been widely applied at present; in the future, the optical interconnection stands a good chance to replace the copper interconnection.

Figure 1:
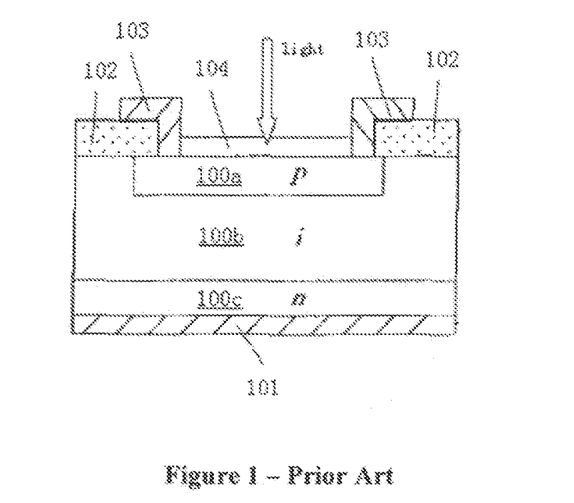
FIG. 1 is a sectional view of the p-i-n photo detector of the prior art.

In the optical interconnection technology, the photo detector converts the optical signals and the electric signal plays the main role. Usually, the photo detector consists of p-i-n diodes. The basic structure is shown in the FIG. 1: a blocking layer (intrinsic layer), namely i layer 100b, is added between the p area 100a and the n area 100c of the common photoelectric diode, and light reaches the p area via an anti-reflection film 104. With a protective film 102 and electrodes 101, 103, when a high reverse bias is applied to the pn node, the blocking layer of the pn node produces photon-generated carriers under the light, and the photon-generated carriers are driven by the external bias to drift directionally so as to produce photo-generated current.

Due to the thick blocking layer, the node capacitance of the p-i-n diode changes are small and the blocking electric field becomes thicker, which enlarges the area for light absorption and light conversion, so the quantum efficiency is improved and the wavelength sensitivity is increased at the same time. However, the thickening of the blocking layer influences the response speed of the photo detector to a large extent, and the p-i-n diode requires a higher bias to make ionizing collisions appear in the diode, so the power consumption is increased.

BRIEF SUMMARY OF THE INVENTION

The present invention aims to provide a photo detector with low product energy consumption and fast response speed.

To fulfill the mentioned aim, the present invention provides a photo detector consisting of tunneling field-effect transistors. The structure of the photo detector comprises:
a semiconductor substrate;
Tunneling field-effect transistor formed on the semiconductor substrate;
and a fiber and reflection layer formed on the tunneling field-effect transistor.

Moreover, the tunneling field-effect transistor has a vertical channel structure, comprising a drain region of a first doping type formed underneath the vertical channel, a resource region of a second doping type formed above the vertical channel, and gate regions formed on two sides of the vertical channel.

Moreover, the angle between the reflection layer and the surface of the semiconductor substrate is 30-60 degrees, and the light rays in the fiber are able to pass through the reflection layer and then reach the source region of the tunneling field-effect transistor, so the photon-generated carriers are produced.

The present invention also provides a method for manufacturing a photo detector consisting of a tunneling field-effect transistor. The method comprises the following steps: Provide a semiconductor substrate;
Perform ion injection to form a doped region of a first doping type in the semiconductor substrate;
Form a hard mask layer;
Form a first photoresist layer;
Mask, expose and etch to form a vertical channel structure of a device;
Strip the first photoresist layer;
Form a first insulating film layer;
Form a first conductive film layer;
Form a second photoresist layer;
Mask, expose and etch the first conductive film layer to form a gate electrode;
Perform ion injection to form a drain region of a second doping type;
Strip the second photoresist layer;
Etch part of the first insulating film layer and etch to remove the rest hard mask;
Form a second insulating film layer and etch the second insulating film layer;
Form a third insulating film layer and etch the second insulating film layer to form a contact hole;
Form a second conductive film layer and etch the second conductive film layer to form an electrode;
Form a lower cladding of a fiber;
Form a core layer of the fiber;
Form an upper cladding of the fiber;
Etch the upper cladding, the core layer and the lower cladding of the fiber to form a slope of 45 degrees;
and form a reflective layer.

Furthermore, the semiconductor substrate may be single-crystalline silicon, polycrystalline silicon or Silicon on the insulator (SOI). The hard mask is made from silicon nitride. The first insulating film may be made from one or mixture of several of $SiO_2$, $HfO_2$, $HfSiO_2$, HfSiON, SiON and $Al_2O_3$. The second and third insulating films are made from silicon dioxide or silicon nitride. The first conductive film is made of metals such as TiN, TaN, $RuO_2$ and Ru or doped polycrystalline silicon. The second conductive film is made of aluminum, tungsten, or other metal materials. The reflective layer is made of a metal material such as aluminum or silver.

Furthermore, the first doping type is an n type, and the second doping type is a p type. Or, the first doping is a p type, and the second doping type is an n type.

In this invention, the tunneling field-effect transistor (TFET) is integrated with the fiber, the TFET with the vertical channel is used as the photo detector to detect light, so the required bias is low, the energy consumption is reduced, and the output current and the sensitivity of the photo detector are improved. Meanwhile, the invention also adopts an autocollimation technology to manufacture the photo detector consisting of the TFET, so the process is more stable and the production cost is reduced.

DETAILED DESCRIPTION OF THE INVENTION

The invention is further described in detail by combining the attached drawings and the embodiments. In the figure, to facilitate description, the layer thickness and region thickness are amplified, but the sizes do not represent the actual dimensions. The figures fail to reflect the actual dimensions of the device accurately, but show the mutual positions of the regions and the structures, specifically the vertical and horizontal neighborhood of the structures.

The reference drawing provides schematic views of an ideal embodiment of the present invention. The embodiment of the present invention shall not be limited to the specific shapes of the regions as shown in the figure, but shall comprise all shapes, like deviations caused by manufacturing. For example, an etched curve is usually characterized by a bend or roundness and smoothness. But in this embodiment, all curves are represented by rectangles. The figure is schematic and shall not be considered as a limit of the present invention. Meanwhile, in the below description, the term "substrate" may be considered to comprise a semiconductor substrate being processed or other films prepared on the semiconductor substrate.

Figure 2:
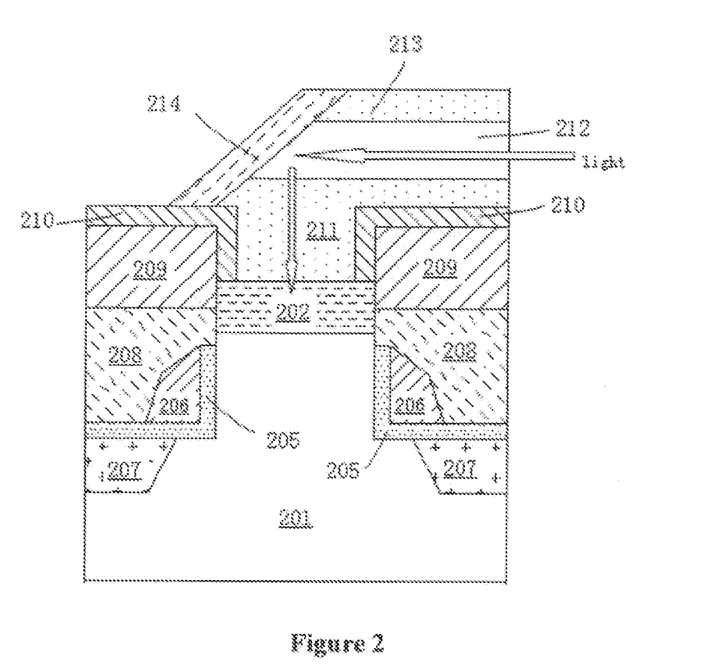
FIG. 2 is a sectional view of the photo detector in one embodiment provided by the present invention.

FIG. 2 illustrates an embodiment of the photo detector consisting of the tunneling field-effect transistor, which is a sectional view along the length direction of the channel of the device. As shown in FIG. 2, the photo detector is formed on a silicon substrate 201, comprising a TFET portion, a fiber portion and a reflection layer 214. The TFET comprises a source region 202, a drain region 207, a gate dielectric layer 205 and a gate electrode 206, and a metal electrode 210 is connected to the position of the source region 202. The fiber comprises a lower cladding 211, a core layer 212 and an upper cladding 213, 208 and 209 represent insulation dielectric layers, for example silicon diode. Light rays in the fiber are able to reach the source region 202 of the TFET after being reflected by the reflection layer 214, to produce the photon-generated carriers. When appropriate voltage is applied to the TFET, the TFET is switched on, and then the photon-generated carriers drift directionally to produce a photon-generated current. The gate voltage of the TFET makes the electric field in the channel rise, so the photon-generated carriers further perform collision ionization. Such phenomenon amplifies the photon-generated current, therefore this kind of devices still have high optical sensitivity under the condition of low voltage at the source region and drain region.

The photo detector consisting of the tunneling field-effect transistor is capable of being manufactured by many methods. The following is the process flow of one embodiment for manufacturing the photo detector as shown in FIG. 2.

Figure 3:
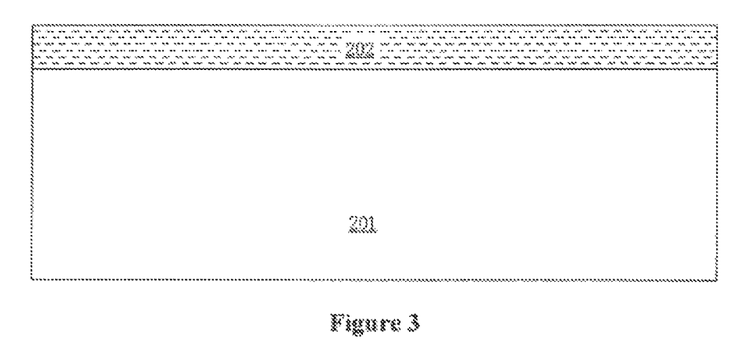
FIGS. 3 to 15 are process flow for manufacturing the photo detector in the embodiment as shown in FIG. 2.
Figure 4:
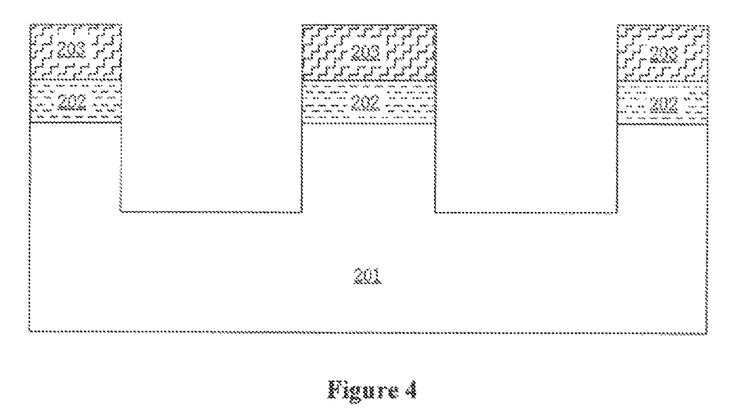

First, provide a silicon substrate 201 and then perform n-type ion injection to form an n-type doped region 202 in the silicon substrate 201, as shown in FIG. 3. Second, deposit a layer of hard mask 203, for example made from silicon nitride, deposit a photoresist layer, perform masking, exposure and development to form a required pattern, etch the hard mask 203 and the silicon substrate 201 to form a vertical channel structure of a device, and strip the photoresist to obtain a product as shown in FIG. 4.

Figure 5:
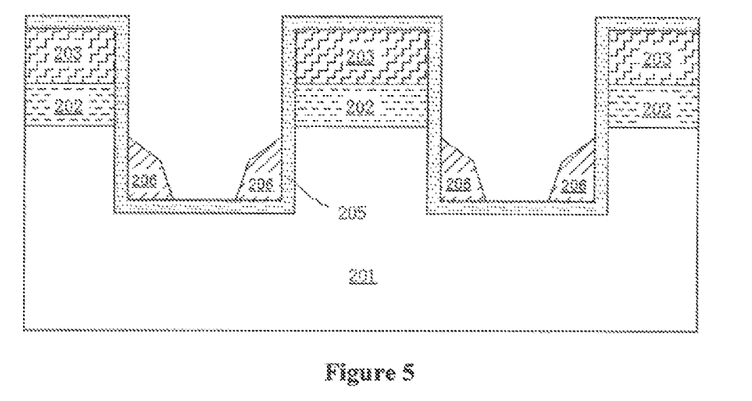

Third, deposit an insulating film 205, a conductive film 206 and a photoresist layer in turn, perform masking, exposure and etching on the conductive film 206 to form a gate electrode of the device, and strip the photoresist to obtain a product a shown in FIG. 5, wherein the insulating film 205 is one or two layers in the silicon dioxide and high-k material layers, and the conductive film 206 may be the doped polycrystalline silicon.

Figure 6:
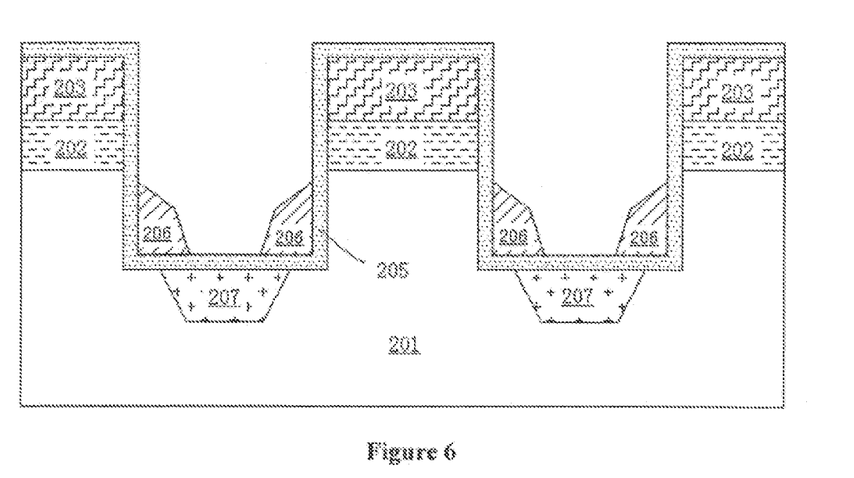

Fourth, perform p-type ion injection to form a drain region 207 of the device, as shown in FIG. 6.

Figure 7:
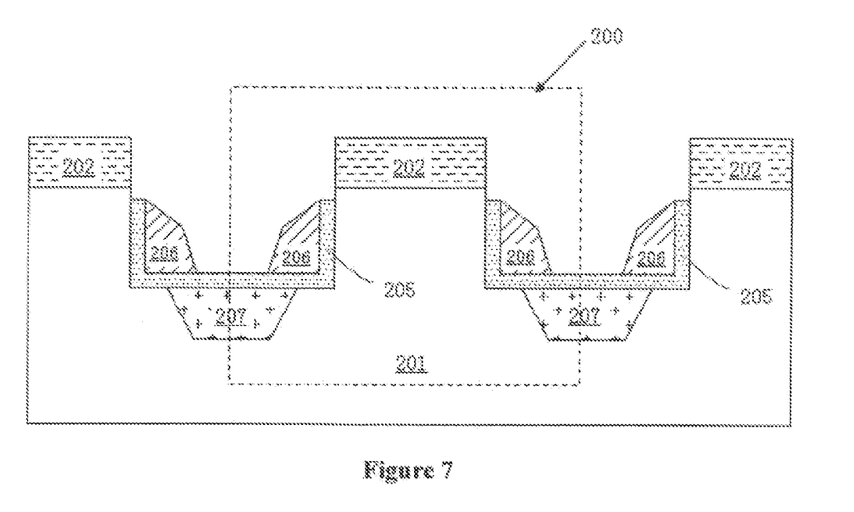
Figure 8:
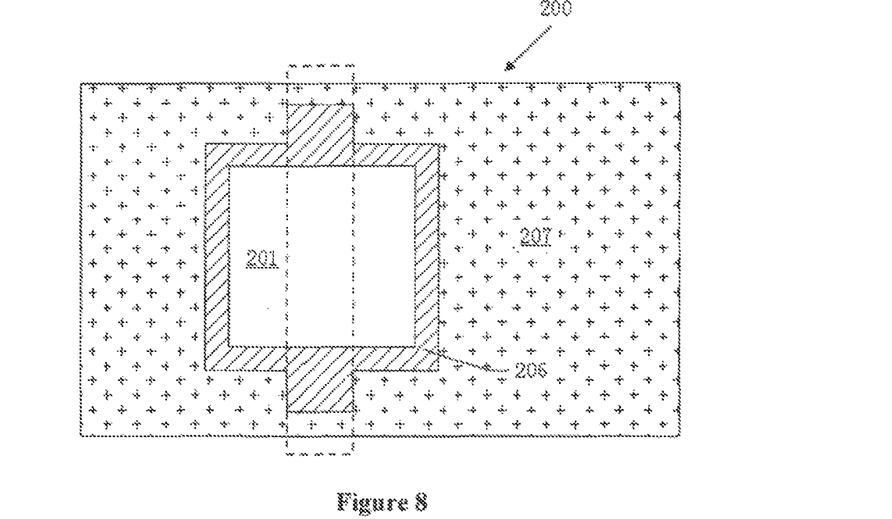

After the drain region 207 is formed, etch to remove part of the insulating film 205 and the rest hard mask 203 to form a structure as shown in FIG. 7. FIG. 8 is a top view of the TFET portion 200 of the structure as shown in FIG. 7.

Figure 9:
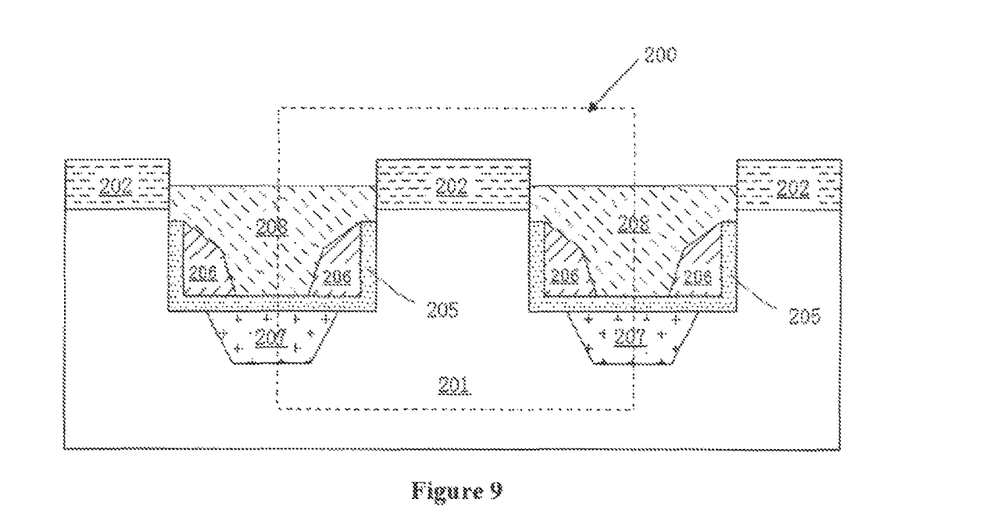
Figure 10:
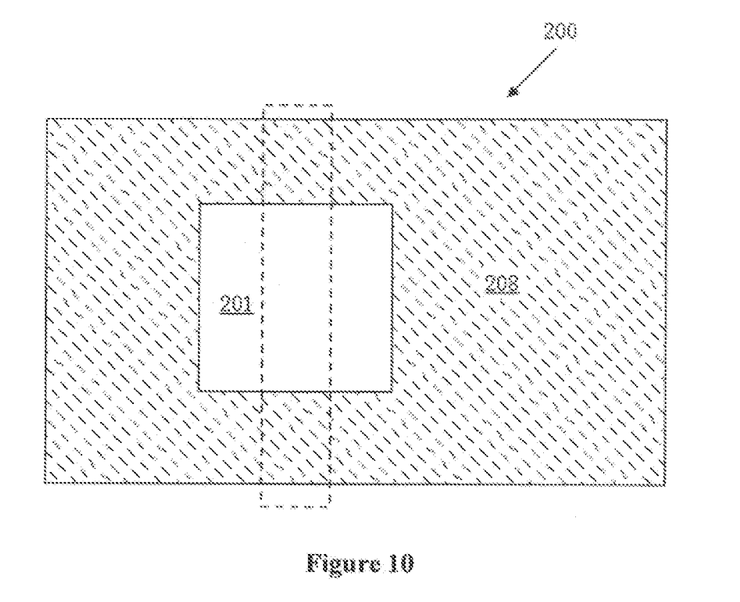

Five, deposit an insulating film 208 which may be made from silicon nitride and etch the silicon diode film 208, as shown in FIG. 9. FIG. 10 is a top view of the TFET portion 200 of the structure as shown in FIG. 9.

The process for manufacturing the photo detector of the present invention is described on the basis of the TFET portion 200 of the structure as shown in FIG. 3f.

Figure 11:
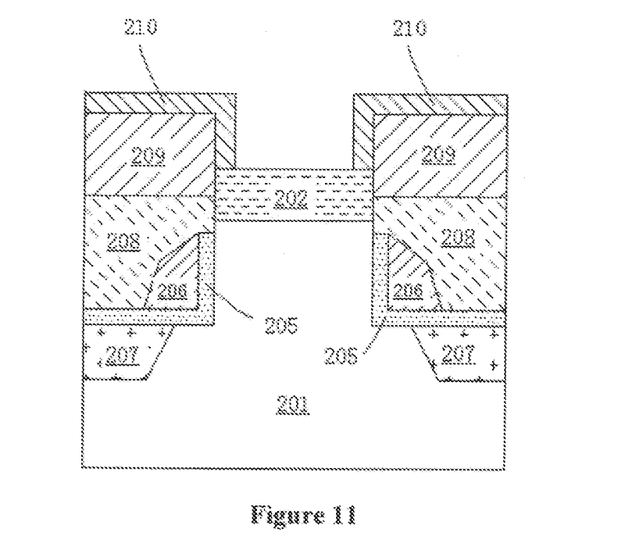

First, deposit an insulating film 209 which may be made from silicon dioxide, etch the silicon dioxide film to form a contact hole, deposit a conductive film 210 which may be made of aluminum, and etch the conductive film 210 to form a metal electrode, as shown in FIG. 11.

Figure 12:
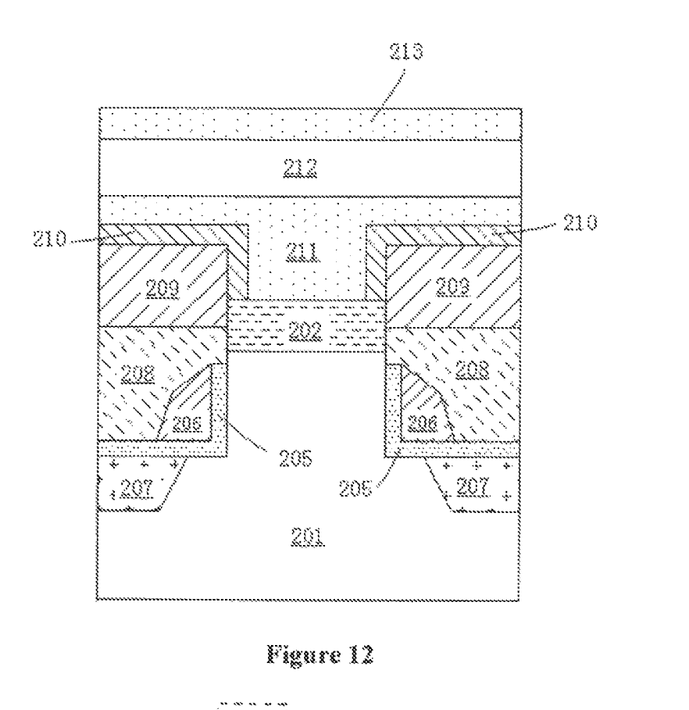
Figure 13:
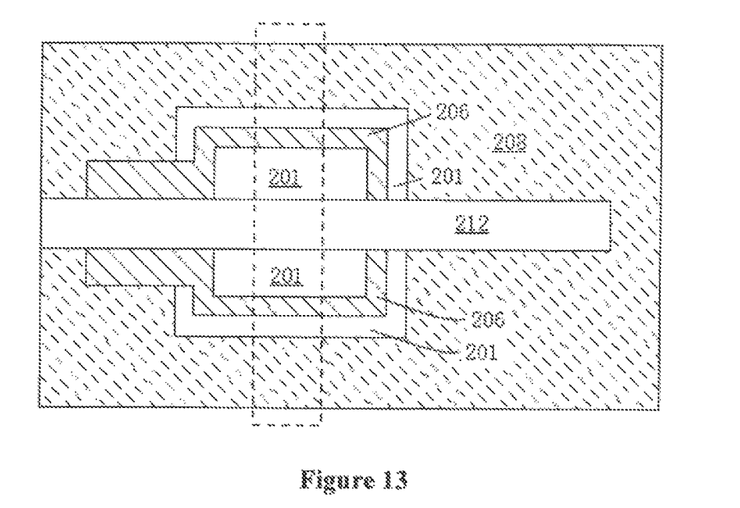
Figure 14:
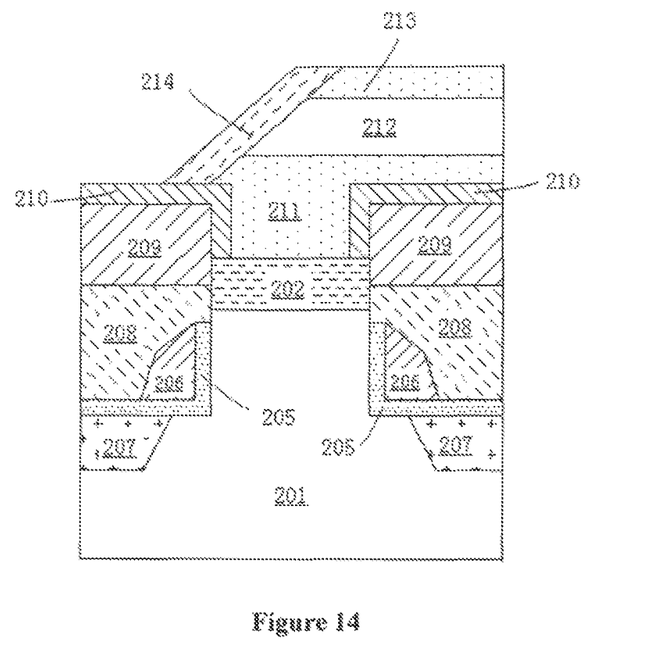
Figure 15:
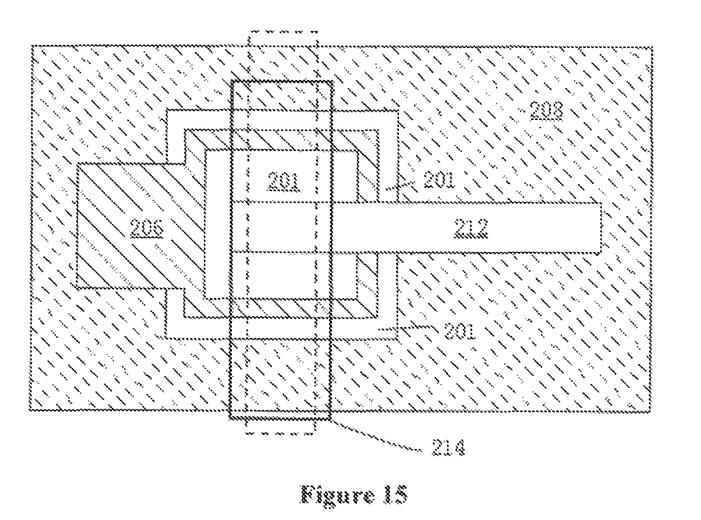

Second, form a lower cladding 211, a core layer 212 and an upper cladding 213 of a fiber in turn, wherein the reflectivity of both the upper cladding 213 and the lower cladding 211 is smaller than that of the core layer 212, as shown in FIG. 12. FIG. 13 is a top view of the structure as shown in FIG. 12;

Third, etch the upper cladding 213, the core layer 212 and the lower cladding 211 of the fiber to form a slope of 45 degrees, deposit a silver metal and then etch the sliver layer to form a reflection layer 214 of the device, as shown in FIG. 14. FIG. 15 is a top view of the structure as shown in FIG. 14;

As mentioned above, a plurality of embodiments with great different may be constructed. It should be noted that, except those defined in the attached claims, the present invention is not limited to the embodiments in the description.

The invention claimed is:

1. A photo detector consisting of tunneling field-effect transistors, comprising:
   a semiconductor substrate;
   a tunneling field-effect transistor formed on the semiconductor substrate;
   and a fiber and reflection layer formed on the tunneling field-effect transistor;
   the tunneling field-effect transistor has a vertical channel structure, comprising a drain region of a first doping type formed underneath the vertical channel, a resource region of a second doping type formed above the vertical channel, and gate regions formed on two sides of the vertical channel; and, wherein the angle between the reflection layer and the surface of the semiconductor substrate is between 30 and 60 degrees, and the light rays in the fiber are able to pass through the reflection layer and then reach the source region of the tunneling field-effect transistor, so that the photon-generated carriers are produced.

2. The photo detector consisting of tunneling field-effect transistors of claim 1, wherein the semiconductor substrate may be single-crystalline silicon, polycrystalline silicon or silicon on insulator (SOI).

3. The photo detector consisting of tunneling field-effect transistors of claim 1, wherein the first doping type is n type, and the second doping type is p type; or, the first doping is p type, and the second doping type is n type.

4. The photo detector consisting of tunneling field-effect transistors of claim 1, wherein the gate region comprises a conductive film and a insulating film separating the conductive film from the vertical channel region.

5. The photo detector consisting of tunneling field-effect transistors of claim 4, wherein the conductive film is made of TiN, TaN, $RuO_2$ Ru or doped polycrystalline silicon.

6. The photo detector consisting of tunneling field-effect transistors of claim 4, wherein the insulating film is made from one or mixture of several of $SiO_2$, $HfO_2$, $HfSiO_2$, HfSiON, SiON and $Al_2O_3$.

7. The photo detector consisting of tunneling field-effect transistors of claim 1, wherein the fiber comprises a core layer and two claddings located in the upper and lower side of the core layer; the reflection rate of the core layer is lower than that of the claddings.

8. The photo detector consisting of tunneling field-effect transistors of claim 1, wherein the reflective layer is made of aluminum or silver.

* * * * *